United States Patent
Lemons et al.

(10) Patent No.: US 12,417,670 B2
(45) Date of Patent: Sep. 16, 2025

(54) TOUCHLESS COMPUTER INTERFACES

(71) Applicant: Touch-Less Gaming, LLC, Chandler, AZ (US)

(72) Inventors: Christina Lynn Lemons, Chandler, AZ (US); Matthew Craig Spencer, Chandler, AZ (US)

( * ) Notice: Subject to any disclaimer, the term of this patent is extended or adjusted under 35 U.S.C. 154(b) by 324 days.

(21) Appl. No.: 18/015,458

(22) PCT Filed: Mar. 5, 2021

(86) PCT No.: PCT/US2021/021238
§ 371 (c)(1),
(2) Date: Jan. 10, 2023

(87) PCT Pub. No.: WO2022/010547
PCT Pub. Date: Jan. 13, 2022

(65) Prior Publication Data
US 2023/0334933 A1    Oct. 19, 2023

Related U.S. Application Data

(60) Provisional application No. 63/050,424, filed on Jul. 10, 2020.

(51) Int. Cl.
*G07F 17/32* (2006.01)
*G06F 3/042* (2006.01)
*H03K 17/96* (2006.01)

(52) U.S. Cl.
CPC ........ *G07F 17/3209* (2013.01); *G06F 3/0421* (2013.01); *H03K 17/9627* (2013.01)

(58) Field of Classification Search
CPC .............. G07F 17/3209; G06F 3/0421; H03K 17/9627
See application file for complete search history.

(56) References Cited

U.S. PATENT DOCUMENTS

| | | | | |
|---|---|---|---|---|
| 4,701,747 A | * | 10/1987 | Isherwood | H03K 17/9629 250/221 |
| 4,849,644 A | * | 7/1989 | Mira | H03K 5/159 250/559.38 |
| 7,486,386 B1 | * | 2/2009 | Holcombe | G01S 17/04 356/5.1 |
| 2002/0067262 A1 | * | 6/2002 | Lie | A47G 29/1214 340/568.1 |
| 2009/0270953 A1 | * | 10/2009 | Ecker | A61B 5/0086 257/E31.127 |
| 2011/0006188 A1 | * | 1/2011 | Lin | G01S 7/497 341/110 |
| 2011/0090147 A1 | * | 4/2011 | Gervais | G06F 3/017 345/157 |
| 2011/0234302 A1 | * | 9/2011 | Utsunomiya | H03K 17/9627 327/514 |

(Continued)

*Primary Examiner* — Steve Rowland
(74) *Attorney, Agent, or Firm* — Newman Law, LLC

(57) ABSTRACT

This application is directed to touchless interfaces. Some embodiments disclosed are directed to plug and play replacements for casino gaming machine touch-based interfaces on, e.g., slot machines. Existing slot machine interfaces can be replaced with touchless interfaces of the inventive subject matter to enable touchless interaction with gaming machines. This allows people in casinos to minimize contact with gaming machines to stymy the spread of diseases like COVID-19.

14 Claims, 2 Drawing Sheets

(56) References Cited

U.S. PATENT DOCUMENTS

| | | | | |
|---|---|---|---|---|
| 2012/0319502 | A1* | 12/2012 | Van Gastel | H03K 17/955 |
| | | | | 307/116 |
| 2014/0028378 | A1* | 1/2014 | Rostamianfar | B66B 1/461 |
| | | | | 327/517 |
| 2014/0340498 | A1* | 11/2014 | Plagemann | G06V 40/28 |
| | | | | 348/77 |
| 2015/0015540 | A1* | 1/2015 | Mankowski | G06F 3/0416 |
| | | | | 345/175 |
| 2015/0137148 | A1* | 5/2015 | Wong | H01L 25/167 |
| | | | | 257/82 |
| 2015/0293599 | A1* | 10/2015 | Shih | G06F 3/017 |
| | | | | 345/173 |
| 2017/0003747 | A1* | 1/2017 | Carceroni | G06F 3/0482 |
| 2019/0272059 | A1* | 9/2019 | Heim | G06F 3/017 |
| 2022/0057888 | A1* | 2/2022 | Li | G01J 1/0271 |
| 2022/0404925 | A1* | 12/2022 | Gray | G06F 3/04166 |

* cited by examiner

TOUCHLESS COMPUTER INTERFACES

FIELD OF THE INVENTION

The field of the invention is touchless interfaces.

BACKGROUND

The background description includes information that may be useful in understanding the present invention. It is not an admission that any of the information provided in this application is prior art or relevant to the presently claimed invention, or that any publication specifically or implicitly referenced is prior art.

With the recent rise in public awareness of the risks of pathogens that can cause epidemics and pandemics (e.g., COVID-19), there comes a new urgency to minimize both direct and indirect personal contact between individuals. And although this urgency comes from the rise of a pandemic, good habits and technology intended to facilitate those good habits have been thrust to the forefront of public discussion. Casinos create many different public health hazards because many different people occupy the same spaces, touch the same surfaces, and play the same games. Because using the same gaming machines results in many people pressing the same buttons and touching the same surfaces there exists a need to minimize this type of indirect contact by creating interfaces that receive touchless inputs.

U.S. Pat. No. 9,452,351 describes proximity sensing to register button presses in casino-based gaming machines. This patent is limited to interfaces that sense disruption in electrical fields as a user's finger approaches a surface. When that disruption is detected, a button or function on the interface can be activated without the player's finger having to ever physically contact a button, push pad, keypad, touch screen, and/or the like. But this system nevertheless requires proximity so close that accidental touching is likely to occur, defeating the purpose of a touchless interface.

Other have made efforts to create touchless interfaces using machine vision, but these efforts require far more complicated sensors and equipment, driving up costs and making large-scale replacement of traditional touch-based interfaces impractical. For example, U.S. Pat. No. 9,135,503 is directed to techniques that facilitate gesture-based user interfaces, implementing machine vision with a camera and associated processing unit to determine whether a specific gesture has been created by a user. The systems described in the '503 patent facilitate fingertip tracking for gesture inputs.

Others have made efforts to create interfaces that track a user's gaze to determine which portion of a screen that user is looking at. For example, U.S. Pat. No. 10,347,072 is directed to a touchless interface that uses eye tracking. With a user's gaze direction known, the user can then interact with the display they are looking at. As with gesture-based inputs that use machine vision, these systems are vastly more complicated and expensive to implement other, simpler systems, making them impractical replacements for existing gaming interfaces.

These and all other extrinsic materials discussed in this application are incorporated by reference in their entirety. Where a definition or use of a term in an incorporated reference is inconsistent or contrary to the definition of that term provided in this application, the definition of that term provided in this application applies and the definition of that term in the reference does not apply.

Thus, there is still a need in the art for touchless user interfaces that help to minimize indirect person to person contact.

SUMMARY OF THE INVENTION

The present invention provides a touchless user interface for use as a replacement to mechanical switches. In one aspect of the inventive subject matter, the touchless user interface is contemplated to include: a first sensor, comprising a first light emitting diode and a first photodiode; a first sensor signal conditioning unit coupled to the first sensor and configured to raise a first sensor output signal HIGH when the first photodiode detects a light pulse of sufficient intensity emitted by the first light emitting diode and reflected off an object; a switch; a microcontroller comprising a timer, coupled to the first sensor signal conditioning unit, the second sensor, the switch, the first visual light emitting diode, and the second visual light emitting diode, wherein the microcontroller comprises programmable logic to perform the following operations: (1) when the first sensor output signal is HIGH, begin the timer; (2) when a pre-specified amount of time has elapsed as indicated by the timer, set the switch to an ON configuration.

In another aspect of the inventive subject matter, the touchless user interface system of further comprises a green light emitting diode coupled to the microcontroller, with the microcontroller configured to activate the green light emitting diode when the switch is set to an ON configuration.

The touchless user interface system may also include a second sensor with a second light emitting diode, a second photodiode, a high-precision timer, and a sensor microcontroller. The sensor microcontroller includes programmed logic to determine, using the high-precision timer, a distance of an object detected by a light pulse received by the second photodiode after emission by the second light emitting diode. The high-precision timer has sufficient resolution to be operative to detect distances light has travelled in a 200 mm round-trip range, e.g., less than 667 picoseconds, and optimally less than 150 picoseconds. With a second sensor, the microcontroller includes programmable logic to begin the timer when both the first sensor output signal is HIGH and the second sensor output indicates an object has been detected within a threshold distance. The microcontroller includes comparison logic to compare the second sensor output with the threshold distance. The second sensor may be coupled to the microcontroller through a serial communications interface, which includes a clock and a data line. The first signal conditioning unit is coupled to the microcontroller through a digital output connected to an input/output pin on the microcontroller, which may be configured as a hardware interrupt line, and it may also be connected to the microcontroller through an analog output.

The touchless user interface system's switch may comprise a system of two optical relays connected to simulate a mechanical switch. A first optical relay connects a "normally open" output port to a "common" output port and a second optical relay connecting the "common" output port to a "normally closed" output port, configured such that an "ON" state activates the first optical relay to close the switch between the normally open and common output ports and deactivates the second optical relay to open the switch between the normally closed and common output ports.

In addition to the green light emitting diode (e.g., a light emitting diode with a green light filter or other diode configuration to produce a green light), or separately, the touchless user interface system can also include a yellow light emitting diode coupled to the microcontroller, which can further include programmable logic to activate the yellow light emitting diode when the timer is activated in step 1—e.g., when both sensors indicate a detected object within a threshold distance—and to deactivate the yellow light emitting diode when the prespecified time has elapsed or when the condition required to run the timer evaluates to false—e.g., when the pre-specified time has elapsed, indicated by the timer, and the switch is set to "ON."

The sensors of the inventive subject matter may be selected to optimally detect objects within 200 mm range or closer, e.g., between 0 and 60 mm.

DETAILED DESCRIPTION

Figure 1:
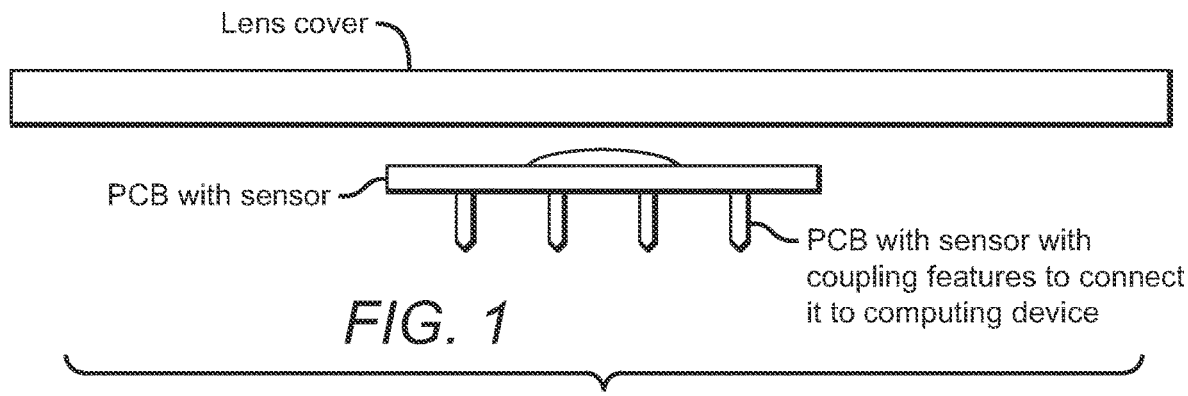
FIG. 1 shows a lens cover over a printed circuit board having a sensor disposed thereon.

The following discussion provides example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used in the description in this application and throughout the claims that follow, the meaning of "a," "an," and "the" includes plural reference unless the context clearly dictates otherwise. Also, as used in the description in this application, the meaning of "in" includes "in" and "on" unless the context clearly dictates otherwise.

Also, as used in this application, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

It should be noted that any language directed to a computer (or microcontroller) should be read to include any suitable combination of computing devices, including servers, interfaces, systems, databases, agents, peers, Engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. The following description includes information that may be useful in understanding the present invention. It is not an admission that any of the information provided in this application is prior art or relevant to the presently claimed invention, or that any publication specifically or implicitly referenced is prior art.

The inventive subject matter is directed to systems and methods that facilitate touchless interaction with computing systems. Computing systems that can implement systems and methods of the inventive subject matter include casino gaming machines. Current gaming machines are geared more and more to immerse the players (especially slot and poker players) into the game through increasing use of touch. With the spread of pathogens like COVID-19, it has become evident person-to-person contact is a major vector for disease spread, and efforts should be made to minimize both direct and indirect contact between persons. Technological improvements that can combat the spread of more serious diseases will similarly prevent the spread of less serious diseases like the common cold. In the context of gambling, for example, because gaming machines in casinos are open 24/7, people in casinos move from machine to machine, touching their faces and mouths and then interacting with those machines to gamble. Gaming machines are thus exposed to germs from many, many different people, creating a burden for disinfecting that may not always be met. Moreover, current push-button designs often incorporate a light source (e.g., an incandescent bulb) that requires periodic replacement, along with a spring-loaded button that is often clogged or jammed by spilled drinks. To solve these problems, embodiments of the inventive subject matter are housed within a plastic mold having a sealed lens to prevent most leaks from damaging its components. These designs obviate the need for a spring-loaded button or a light source. Because embodiments of the inventive subject matter do not require physical interaction, they are also far more durable than existing systems. Moreover, embodiments are made at least in part from durable, shock-resistant materials (e.g., plastics, composites, rubbers, ceramics, glass, or any combination thereof) that are designed to withstand the rigors of gaming where, e.g., users may become excited or frustrated and bang on gaming machines' surfaces.

FIG. 1 shows an example system having a lens cover (e.g., made from a plastic such as acrylic or from glass) and a printed circuit board (PCB) disposed below the lens cover. The PCB has an integrated motion sensor and can additionally include a microcontroller with a voltage converter and electronic switch, and it includes coupling features that facilitate plug-and-play coupling the system with an existing gaming machine. By including coupling features to allow for plug-and-play inclusion into existing systems, those existing systems can easily be retrofit with touchless systems of the inventive subject matter.

Figure 2:
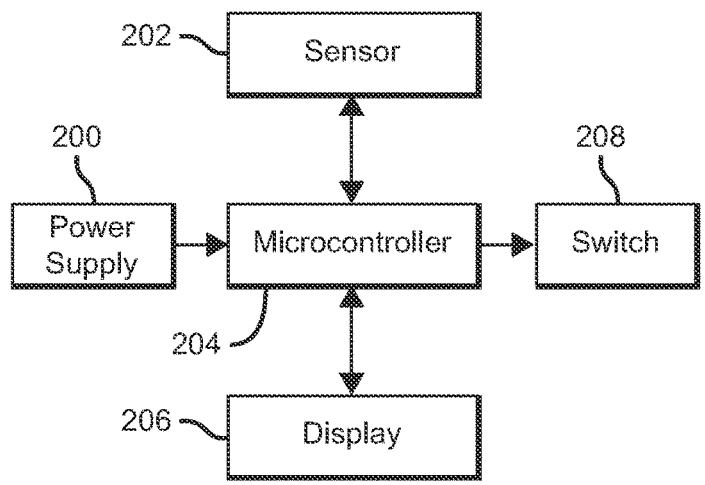
FIG. 2 shows a schematic of an embodiment of the inventive subject matter.

FIG. 2 shows a breakdown of components of a system of the inventive subject matter. It includes a sensor 202, a microcontroller 204, a display 206, and a switch 208.

Microcontroller 204 is configured to receive signals from sensor 202. Microcontroller 204 may comprise, for example, a Reduced Instruction Set Computer processor, an eight-bit timer, a sixteen-bit timer, an extended watchdog timer with a dedicated on-chip oscillator, a flash memory unit, an SRAM memory unit, an EEPROM unit, a clock output, and a data output comprising a series of general purpose in/out pins. Microcontroller 204 may further comprise a serial communications module, a data signal modulator, and a voltage comparator. Microcontroller 204 may comprise, e.g., the microcontroller described in Microchip PIC16(L) F18326/18346 datasheet, which is incorporated herein by reference.

Sensor 202, which is included on the PCB as described above regarding FIG. 1, is configured to detect movement and, in response to that movement, send a signal to the microcontroller 204. Sensor sensitivity can be adjusted manually (e.g., by turning an adjustment dial on the sensor or the PCB) and electronically by signal from the microcontroller. In manual adjustment, the manual dials send signals to the microcontroller, which may then transmit serial communications to the sensor 2020 to adjust settings. Sensor 202 can be a passive infrared sensor (PIR), a microwave sensor, capacitive sensor, and, in some embodiments, sensor 202 can comprise diodes that emit and detect light (e.g., infrared light or other wavelengths), in which the detected light is reflected on an object and originates from the emitter. In some embodiments, sensor 202 comprises an infrared emitter diode and a separate photodiode, housed together in a small surface-mount package (e.g., 2.4 mm or 2.7 mm height), with a low dark current and high signal to noise ratio. In another embodiment, sensor 202 comprises a laser diode or other laser housing that emits electromagnetic radiation at a first wavelength, e.g., 940 nanometers, and a photodiode that is responsive to electromagnetic radiation at the first wavelength; sensor 202 additionally comprises timing circuitry, such that a time elapsed between a laser emission and laser reception at the first wavelength can be measured and a distance can be determined.

Figure 2A:
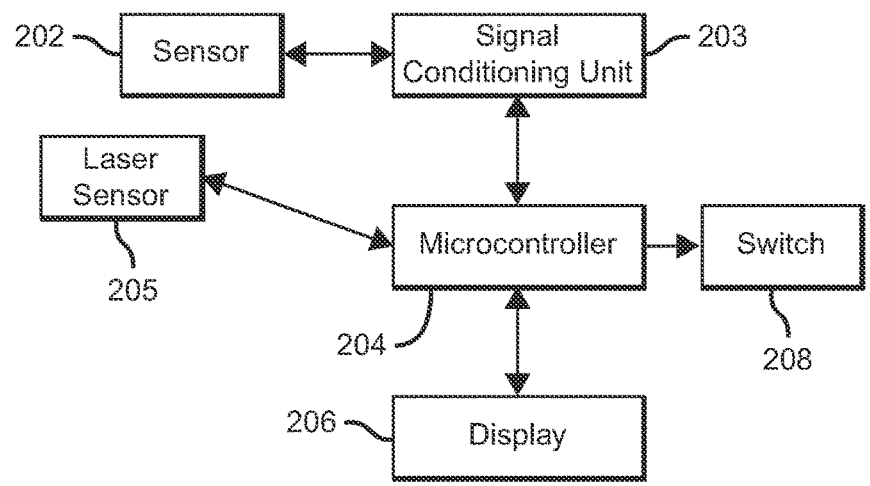
FIG. 2a shows an additional schematic of an embodiment of the inventive subject matter.
Figure 3:
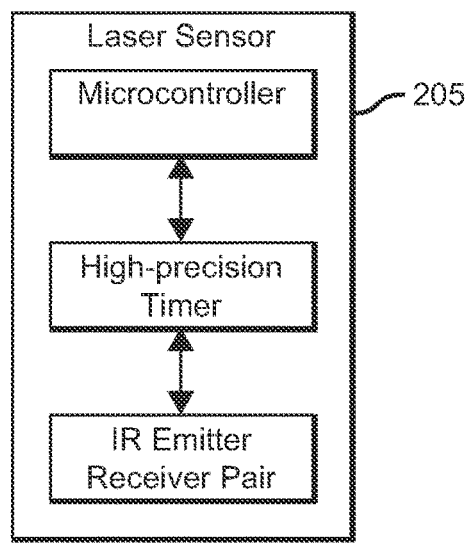
FIG. 3 depicts a block diagram of a sensor for use in the invention.

In another embodiment, e.g., as depicted in FIG. 2a, a second sensor 205, comprising high-precision (e.g., <150 ps or <1 ns) timing circuitry and a laser emitter/receiver pair, is coupled to the microcontroller via a serial connection line and serial clock, an interrupt line, and a power-up line, connected to general purpose input/output pins of the microcontroller. Second sensor 205 provides additional redundancy and resolution in detection that is important in high-accuracy applications, such as gaming.

In some embodiments, e.g., as depicted in FIG. 2a, sensor 202 is configured to connect its signal input/output, e.g. a first line corresponding to voltage driving the emitter diode and a second line corresponding to voltage generated by the separate photodiode, to a Signal Conditioning Unit 203, which comprises a sunlight cancellation unit, a stuck-high protection unit, a filter circuit to filter out ambient light, an LED input driver line, and a hysteresis comparator to determine the "on" or "off" state of the photodiode of sensor 202. In such operation, Signal Conditioning Unit 203 passes an input pulse received on the LED input driver line to the first line after passing it through the stuck-high protection unit. The stuck-high protection unit ensures that only pulsed signals of the LED input driver line are passed to the emitter of sensor 202, i.e. if the LED input driver line is high for greater than a maximum pulse width, the first line corresponding to voltage driving the emitter diode will turn off. In normal operation, a data output line on microcontroller 204 connects to the LED input driver line of Signal Conditioning Unit 203. In normal operation, Signal Conditioning Unit 203 outputs the result of the hysteresis comparator to a digital signal output, such that when the output of the photodiode of sensor 202 after passing through a sunlight cancellation unit, is greater than a threshold level, Signal Conditioning Unit 203 will raise the digital signal output line high to indicate detection of an object within a distance, e.g. 60 mm or 200 mm, from the sensor 202. The sunlight cancellation unit is configured to reduce or eliminate the effects of sunlight on the photodiode's signal. In addition, Signal Conditioning Unit 203 may output an analog signal, which comprises the input to the hysteresis comparator that is output directly to a first analog input line on microcontroller 204. Both the digital signal output line and the analog output line may be connected to microcontroller 204.

In some embodiments, sensor 202 is configured to detect whether an object (e.g., a user's digit, hand, or an object held by the user) exists within a threshold distance of the sensor (e.g., 0.5-1", 1-1.5", 1.5-2", 2-3", 3-5", etc.). Once presence of an object is detected by sensor 202, sensor 202 sends a signal to microcontroller 204, and microcontroller 204 begins tracking an elapsed time. Elapsed time is tracked while an object remains within the threshold distance of sensor 202, and, once a predetermined amount of time has elapsed (e.g., greater than 1 sec, 2 sec, 3 sec, 4 sec, etc.), microcontroller 204 registers a virtual button press and activates switch 208. This can help to prevent false positive button triggering from a user accidentally bringing a hand or other object within range of a sensor of the inventive subject matter.

In some embodiments, detection by microcontroller 204 is initiated by periodically initiating a pulse from the microcontroller 204 to the sensor 202, e.g., via the LED input driver line on the signal conditioning unit. After initiating a pulse, the microcontroller 204 may then proceed to a detection phase. In some embodiments, such detection is accomplished through periodic polling of the sensor 202 connected, e.g., using signal conditioning unit 203. Such design is beneficial because it increases predictability of program flow on microcontroller 204. In other embodiments, detection is accomplished through a hardware interrupt that causes program execution on microcontroller 204 to jump to software code when the digital output of sensor 202 via signal conditioning unit 203 is high.

Microcontroller 204 is configured to activate display 206 and to interpret signals from sensor 202, and, in embodiments where present, second sensor 205. In some embodiments, display 206 features a display screen (e.g., LCD or the like). In some embodiments, display 206 comprises one or more LED lights, such as a first green LED and a second yellow LED. For example, display 206 can provide information to a user from an indicator light that is either on or off up through an LCD display that presents more detailed information of all kinds (e.g., numbers, images, videos, etc.). The time elapsed may thus indicate to microcontroller 204 a closer proximity than the maximum sensor range. Microcontroller 204 may register a button press when, for example, sensor 202 raises a detection signal above a threshold value, where the detection signal is input to the microcontroller. Microcontroller 204 may also register a button press when both sensor 202 and second sensor 205 register a detection signal—e.g., when sensor 202 raises a detection signal above a threshold value and second sensor 205 sends a serial communication signal to the microcontroller 204 indicating detection of an object at below a threshold distance.

It is contemplated that systems of the inventive subject matter can be configured to fit into any space occupied by a physical button. Thus, display 206 rests beneath a top surface (e.g., the lens cover shown in FIG. 1) and can be configured to provide visual feedback regarding button presses. Because button activation based on proximity does not provide tactile feedback to users, visual feedback via display 206 can be introduced instead. For example, when a user placed their finger within the predetermined threshold distance of a sensor, the display can activate a first light (e.g., red or yellow) and if the user leaves their finger within that predetermined distance for the predetermined amount of time, once that time has elapsed, the display can activate a green light, indicating a button press has been registered. In some embodiments, different visual indicators can be implemented, such as a light that gradually changes colors over the course of the predetermined amount (e.g., from red to green with a change in brightness like a flash at the end indicating a registered button press).

Figure 4:
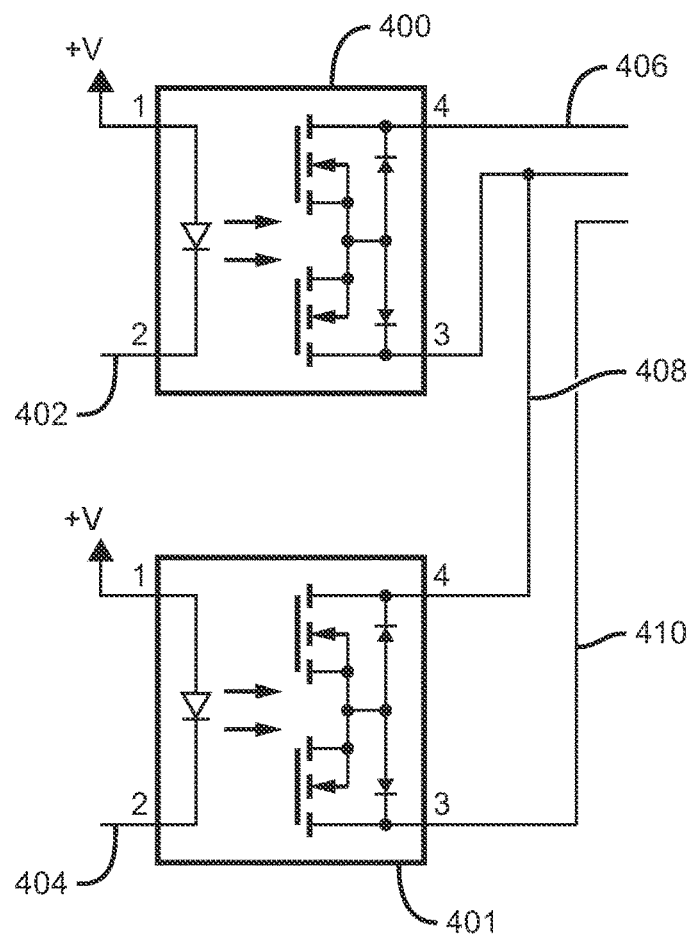
FIG. 4 depicts a diagram of a switch for use in the invention.

When a button press is registered, microcontroller 204 activates switch 208. Switch 208 may comprise, e.g., two optical relays coupled to a "normal open," "common," and "normal closed" outputs. A first optical relay may be coupled to a first general purpose input/output pin of the microcontroller 204, and a second optical relay may be coupled to a second general purpose input/output pin of microcontroller 204. FIG. 4 depicts an optical relay system according to this configuration, including first optical relay 400, second optical relay 401, first optical relay input 402, second optical relay input 404, normal open output 406, common output 408, and normal closed output 410. In ordinary operation, first optical relay input 402 is low when the switch is off, such that the line between normal open output 406 and common output 408 is open; conversely, second optical relay output 404 is held high when the switch is off, such that the line between the common output 408 and normal closed output 410 is closed. First optical relay input 402 and second optical relay input 404 may be connected to outputs of the microcontroller 204. Alternatively, the second optical relay may be connected to the first general purpose input/output pin of microcontroller 204 passed through a NOT gate, thereby saving an input/output pin of microcontroller 204 for another use. Switch 208 can be configured to emulate an ON-MOM switches in physical buttons (e.g., a switch capable of being on, off, or momentarily on) that systems of the inventive subject matter can be designed to replace. When switch 208 is activated, electrical signals are passed to a host machine in which a system of the inventive subject matter has replaced a physical button, imitating the electrical outputs of the replaced button. Switch 208 can include one or more transistors and it can also refer to a switching subcircuit that includes a variety of different integrated circuit components that bring about the desired switching behaviors.

As described above, embodiments of the inventive subject matter replace mechanical buttons with a combination of motion or proximity sensing and electronic switching. Embodiments are configured to sense that a user is near the device (e.g., waving a hand over an "actuation zone" near the sensor), which then triggers the switch to close emulating a button press by the user. LED's are also added as visual indicators of button activation to provide visual feedback to the user.

Thus, specific systems and methods directed to touchless interfaces have been disclosed. It should be apparent, however, to those skilled in the art that many more modifications besides those already described are possible without departing from the inventive concepts in this application. The inventive subject matter, therefore, is not to be restricted except in the spirit of the disclosure. Moreover, in interpreting the disclosure all terms should be interpreted in the broadest possible manner consistent with the context. In particular the terms "comprises" and "comprising" should be interpreted as referring to the elements, components, or steps in a non-exclusive manner, indicating that the referenced elements, components, or steps can be present, or utilized, or combined with other elements, components, or steps that are not expressly referenced.

What is claimed is:

1. A touchless user interface comprising:
   a first sensor, comprising a first light emitting diode and a first photodiode;
   a first sensor signal conditioning unit coupled to the first sensor and configured to raise a first sensor output signal HIGH when the first photodiode detects a light pulse of sufficient intensity emitted by the first light emitting diode and reflected off an object;
   a switch;
   a microcontroller comprising a timer, coupled to the first sensor signal conditioning unit and the switch, wherein the microcontroller comprises programmable logic to perform the following operations: (1) when the first sensor output signal is HIGH, begin the timer; (2) when a pre-specified amount of time has elapsed as indicated by the timer, set the switch to an ON configuration;
   a second sensor comprising a second light emitting diode, a second photodiode, a high-precision timer, and a sensor microcontroller, wherein the sensor microcontroller is configured to determine a distance of an object detected by a light pulse received by the second photodiode after emission by the second light emitting diode using the high-precision timer, wherein the microcontroller is coupled to the second sensor via a second sensor interface and is configured to begin the timer at step 1 when both the first sensor output signal is HIGH and the second sensor interface indicates an object has been detected within a threshold distance.

2. The touchless user interface system of claim 1, further comprising a green light emitting diode coupled to the microcontroller, wherein the microcontroller is further configured to activate the green light emitting diode when the switch is set to an ON configuration.

3. The touchless user interface system of claim 1, wherein the second sensor interface is a serial communications interface.

4. The touchless user interface system of claim 1, wherein the first sensor signal conditioning unit is coupled to the microcontroller through a digital output from the first signal conditioning unit to a hardware interrupt line on the microcontroller and through an analog output from the first signal conditioning unit to an analog input of the microcontroller.

5. The touchless user interface system of claim 1, wherein the switch comprises a first optical relay connecting a normally open output port to a common output port and a second optical relay connecting the common output port to a normally closed output port, configured such that an "ON" state activates the first optical relay to close the switch between the normally open and common output ports and deactivates the second optical relay to open the switch between the normally closed and common output ports.

6. The touchless user interface system of claim 1, further comprising a yellow light emitting diode coupled to the microcontroller, wherein the microcontroller further comprises programmable logic to activate the yellow light emitting diode when the timer is activated in step 1 and to deactivate the yellow light emitting diode when the pre-specified time has elapsed.

7. A touchless user interface comprising:
   a first sensor, comprising a first light emitting diode and a first photodiode;
   a first sensor signal conditioning unit coupled to the first sensor and configured to raise a first sensor output signal HIGH when the first photodiode detects a light pulse emitted by the first light emitting diode and reflected off an object within a range;

a second sensor, comprising a second light emitting diode, a second photodiode, a high-precision timer, and a sensor microcontroller, wherein the sensor microcontroller is configured to determine a distance of an object detected by a light pulse received by the second photodiode after emission by the second light emitting diode using the high-precision timer;

a switch;

a first visual light emitting diode;

a second visual light emitting diode;

a microcontroller comprising a timer, coupled to the first sensor signal conditioning unit, the second sensor, the switch, the first visual light emitting diode, and the second visual light emitting diode, wherein the microcontroller is configured to perform the following operations: (1) when the first sensor output signal is HIGH and the second sensor output indicates an object has been detected below a pre-specified threshold distance, begin the timer; (2) when a pre-specified amount of time has elapsed as indicated by the timer, set the switch to an ON configuration.

8. The touchless user interface system of claim 7, wherein the switch comprises a first optical relay connecting a "normally open" output port to a "common" output port and a second optical relay connecting the "common" output port to a "normally closed" output port, configured such that an "ON" state activates the first optical relay to close the switch between the normally open and common output ports and deactivates the second optical relay to open the switch between the normally closed and common output ports.

9. The touchless user interface system of claim 7, wherein the first sensor detects objects at distances between 0 and 60 mm.

10. The touchless user interface system of claim 9, wherein the second sensor detects objects and determines a range for objects at distances between 0 and 200 mm.

11. The touchless user interface system of claim 7, wherein the high-precision timer of the second sensor operates at a resolution of at least 150 picoseconds.

12. A touchless user interface comprising:

a first sensor, comprising a first light emitting diode, a first photodiode, a high-precision timer, and a sensor microcontroller, wherein the sensor microcontroller comprises programmable logic to determine a distance of an object detected by a light pulse received by the first photodiode after emission by the first light emitting diode using the high-precision timer;

a switch;

a microcontroller comprising a timer, coupled to the first sensor and the switch, wherein the microcontroller is configured to perform the following operations: (1) when the first sensor output signal indicates the distance of a detected object is below a threshold distance, begin the timer; (2) when a pre-specified amount of time has elapsed as indicated by the timer, set the switch to an ON configuration.

13. The touchless user interface system of claim 12, wherein the switch comprises a first optical relay connecting a "normally open" output port to a "common" output port and a second optical relay connecting the "common" output port to a "normally closed" output port, configured such that an "ON" state activates the first optical relay to close the switch between the normally open and common output ports and deactivates the second optical relay to open the switch between the normally closed and common output ports.

14. The touchless user interface system of claim 12, wherein the first sensor is coupled to the microcontroller through a serial communications interface.

* * * * *